United States Patent
Samavedam et al.

(10) Patent No.: US 7,683,439 B2
(45) Date of Patent: Mar. 23, 2010

(54) SEMICONDUCTOR DEVICE HAVING A METAL CARBIDE GATE WITH AN ELECTROPOSITIVE ELEMENT AND A METHOD OF MAKING THE SAME

(75) Inventors: Srikanth B. Samavedam, Austin, TX (US); David C. Gilmer, Austin, TX (US); Mark V. Raymond, Austin, TX (US); James K. Schaeffer, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 340 days.

(21) Appl. No.: 11/685,027

(22) Filed: Mar. 12, 2007

(65) Prior Publication Data

US 2008/0224185 A1 Sep. 18, 2008

(51) Int. Cl.
*H01L 27/088* (2006.01)
(52) U.S. Cl. ............... 257/402; 257/407; 257/E29.255; 257/E21.409; 438/197
(58) Field of Classification Search ............. 257/402, 257/407, 412, E29.255, E21.409; 438/197
See application file for complete search history.

(56) References Cited

U.S. PATENT DOCUMENTS 6,953,947 B2 * 10/2005 Son et al. ............... 257/40
7,297,588 B2    11/2007 Adetutu et al.
2006/0197166 A1 *  9/2006 Yamaguchi et al. ......... 257/412
2007/0158702 A1 *  7/2007 Doczy et al. ................ 257/288

OTHER PUBLICATIONS

Narayanan, et al., "Band-Edge High-Performance High-k/Metal Gate n-MOSFETs using Cap Layers Containing Group IIA and IIIB Elements with Gate-First Processing for 45 nm and Beyond", 2006 VLSI Technology Symposium, Jun. 2006.
Alshareef, et al., "Thermally Stable N-Metal Gate MOSFETs Using La-Incorporated HfSiO Dielectric", 2006 VLSI Technology Symposium, Jun. 2006.

* cited by examiner

*Primary Examiner*—Zandra Smith
*Assistant Examiner*—Paul E Patton
(74) *Attorney, Agent, or Firm*—Kim-Marie Vo; James L. Clingan, Jr.

(57) ABSTRACT

A semiconductor device structure is formed over a semiconductor substrate and has a gate dielectric over the semiconductor substrate and a gate over the gate dielectric. The gate, at an interface with the gate dielectric, comprises a transition metal, carbon, and an electropositive element. The transition metal comprises one of group consisting of tantalum, titanium, hafnium, zirconium, molybdenum, and tungsten. The electropositive element comprises one of a group consisting of a Group IIA element, a Group IIIB element, and lanthanide series element.

9 Claims, 5 Drawing Sheets

SEMICONDUCTOR DEVICE HAVING A METAL CARBIDE GATE WITH AN ELECTROPOSITIVE ELEMENT AND A METHOD OF MAKING THE SAME

BACKGROUND

1. Field

This disclosure relates generally to semiconductor devices and methods of making the same, and more specifically, to a semiconductor device having metal carbide gate containing an electropositive element and a method of making the same.

2. Related Art

Semiconductor devices having metal gates and high-K gate dielectrics have a high threshold voltage resulting in lower effective drive currents and degraded short channel characteristics. Threshold voltages of N-channel devices can be lowered by reducing the work function of the gate layer. It has been shown that the threshold voltage can be lowered by adding compounds, such as magnesium oxide to the gate dielectric layer. While the addition of such compounds helps in lowering the device threshold voltage, the effective oxide thickness of the gate stack increases limiting device scaling. Minimizing the effective oxide thickness has been the predominate path to performance improvements for many years and is required for device scaling. In addition, the presence of magnesium oxide will make any dual-metal gate integration scheme more challenging since the magnesium oxide layer would need to be removed from the P-channel regions without adversely affecting the high-K gate dielectric material.

Accordingly, there is a need for a semiconductor device having a metal carbide gate containing an electropositive element and a method of making the same.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a semiconductor device structure formed over a semiconductor substrate is provided. The semiconductor device structure includes a gate dielectric over the semiconductor substrate. The semiconductor device structure further includes a gate over the gate dielectric, wherein the gate, at a direct interface with the gate dielectric, comprises a transition metal, carbon, and an electropositive element. The transition metal is selected from a group consisting of tantalum, titanium, hafnium, zirconium, molybdenum, and tungsten. The electropositive element is selected from a group consisting of a Group IIA element, a Group IIIB element, and lanthanide series element.

In another aspect, a semiconductor device structure formed over a semiconductor substrate is provided. The semiconductor device structure includes a gate dielectric over the semiconductor substrate. The semiconductor device structure further includes a gate comprising a first conductive layer, having a direct interface with the gate dielectric, comprising tantalum, magnesium, and carbon.

In yet another aspect, method of forming a semiconductor device over a semiconductor substrate is provided. The method includes forming a gate dielectric over the semiconductor substrate. The method further includes forming a first conductive layer directly on the gate dielectric comprising a transition metal, carbon, and an electropositive element. The transition metal is selected from a group consisting of tantalum, titanium, hafnium, zirconium, molybdenum, and tungsten. The electropositive element is selected from a group consisting of a Group IIA element, a Group IIIB element, and lanthanide series element.

Figure 1:
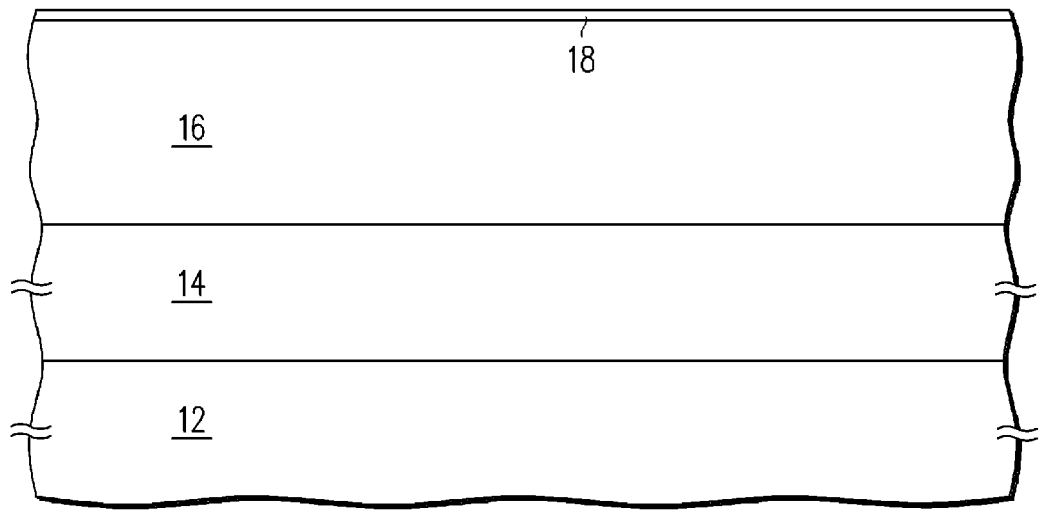
FIG. 1 is a view of a semiconductor device during a processing stage.

FIG. 1 shows a view of a semiconductor device 10 during a processing step. Semiconductor device 10 may comprise a device formed using semiconductor material 16 on a buried oxide layer (BOX) 14, over a substrate 12. The semiconductor material 16 described herein can be any semiconductor material or combinations of materials, such as gallium arsenide, silicon germanium, silicon, the like, and combinations of the above. Although FIG. 1 shows a SOI implementation, semiconductor device 10 may be formed over bulk substrate, as well. Semiconductor device 10 may further contain a gate dielectric layer 18, such as an oxide layer over semiconductor material 16. By way of example, semiconductor device 10 may be an N-channel device.

Figure 2:
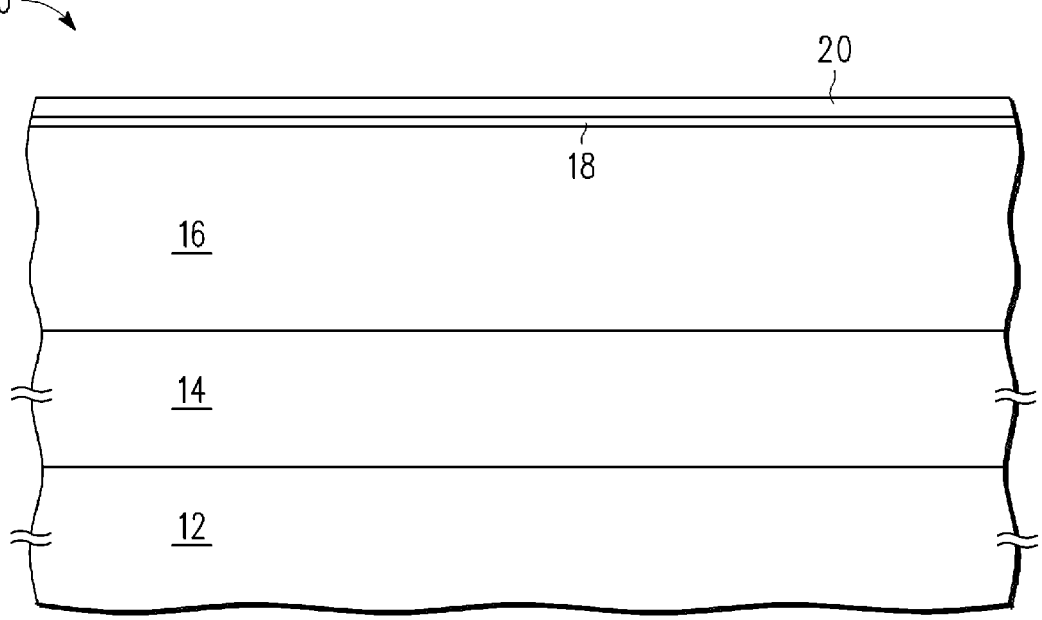
FIG. 2 is a view of a semiconductor device during a processing step.

As shown in FIG. 2, a metal gate layer 20 containing carbon and an electropositive element may be formed over gate dielectric layer 18. Electropositive element may be selected from a group of elements from the periodic table, including elemental groups IIA, IIIB, and from the Lanthanide series. By way of example, electropositive element may be one of magnesium, lanthanum, yttrium, gadolinium, erbium, and ytterbium. Metal gate layer 20 may further contain a transition metal. Transition metal may be selected from a group consisting of titanium, hafnium, tantalum, zirconium, molybdenum, and tungsten. By way of example, metal gate layer 20 may be formed by co-sputtering the transition metal and the electropositive element in methane gas. In one embodiment, tantalum and magnesium may be co-sputtered in the presence of methane gas to form a layer of $Ta_xMg_{1-x}C$ as metal gate layer 20 over gate dielectric layer 18. By way of example, x may have a value of 0.5 to 1.1 resulting in a tantalum atomic concentration in a range of 25 to 55 percent, magnesium atomic concentration in a range of 3 to 25 percent, and carbon atomic concentration in a range of 40 to 55 percent. In another embodiment, tantalum and magnesium may be co-sputtered in the presence of methane gas and nitrogen to form a layer of $Ta_xMg_{1-x}C_yN_{1-y}$ as metal gate layer 20 over gate dielectric layer 18. By way of example, y may have a value of 0.1 to 1.1. In yet another embodiment, tantalum and magnesium may be co-sputtered in the presence of methane gas and oxygen to form a layer of $Ta_xMg_{1-x}C_yO_{1-y}$ as metal gate layer 20 over gate dielectric layer 18. Any of these layers may be formed using other processes, such as atomic layer deposition (ALD), molecular beam deposition (MBD), and chemical vapor deposition (CVD). By way of example, metal gate layer 20 may have a thickness in a range of 20-100 Angstroms.

Figure 3:
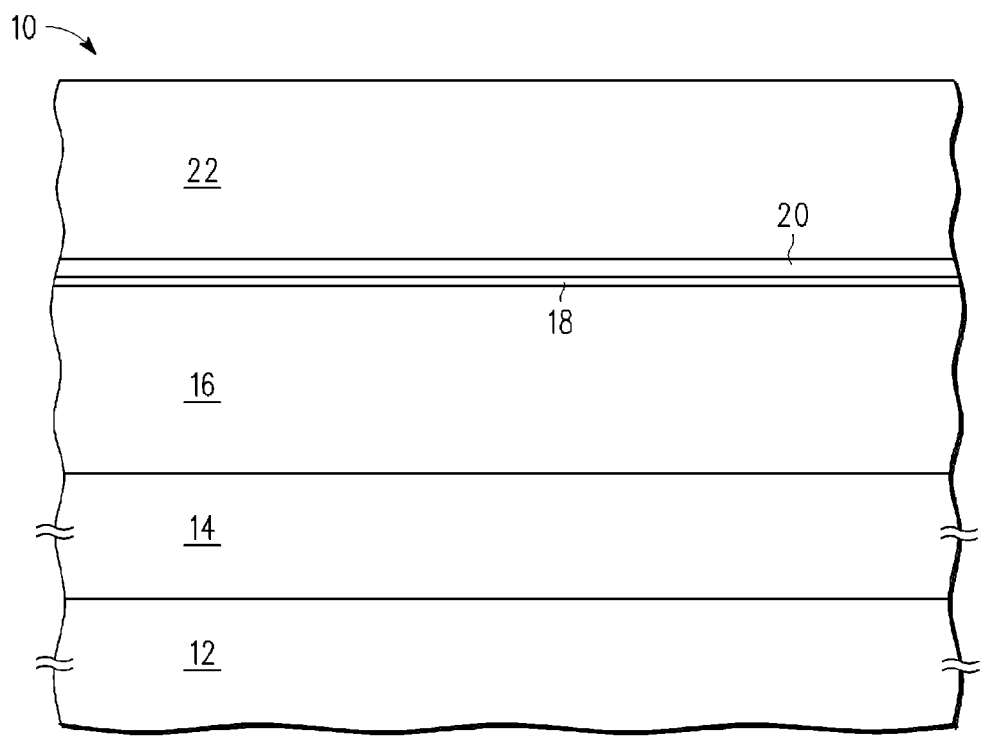
FIG. 3 is a view of a semiconductor device during a processing step.

Next, as shown in FIG. 3, a polysilicon layer 22 may be formed over metal gate layer 20.

Figure 4:
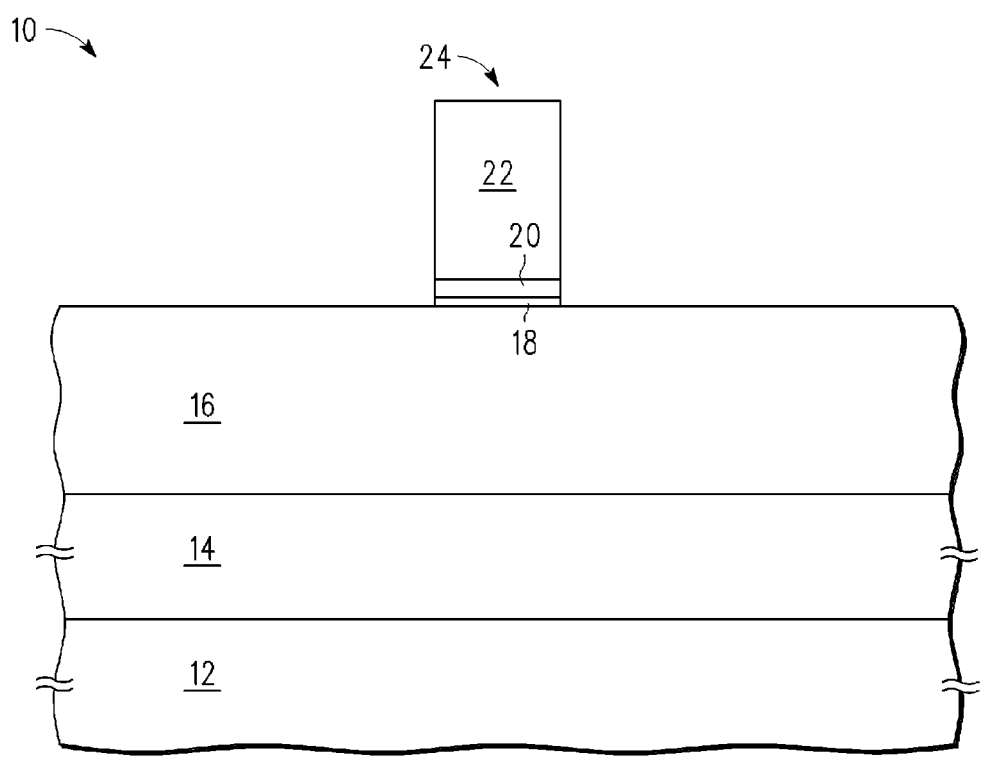
FIG. 4 is a view of a semiconductor device during a processing step.

Next, as shown in FIG. 4, gate dielectric layer 18, metal gate layer 20, and polysilicon layer 22 may be patterned to form a gate stack 24. The addition of an electropositive element as described above would lower the work function of metal gate layer 20 and thereby lowering the threshold voltage of an N-channel semiconductor device formed using metal gate layer 20.

Figure 5:
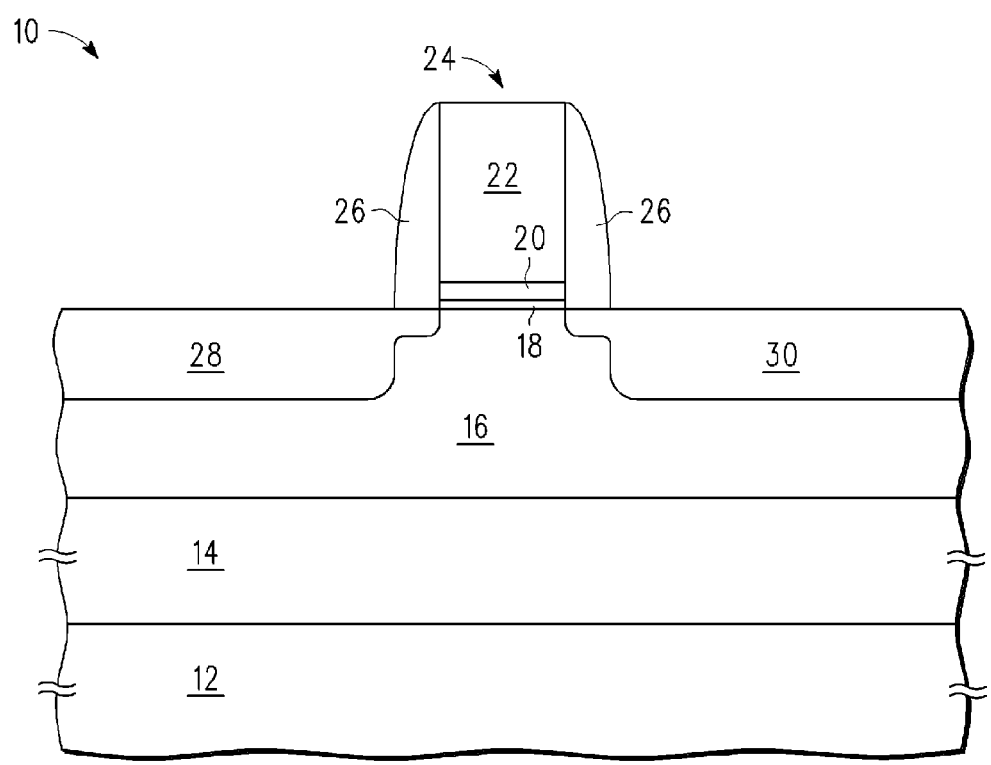
FIG. 5 is a view of a semiconductor device during a processing step.

Next, as shown in FIG. 5, a sidewall spacer 26 may be formed adjacent to gate stack 24. Further, source/drain regions 28 and 30 may be formed to complete the processing of semiconductor device 10. Additional features may be formed as part of semiconductor device 10.

Figure 6:
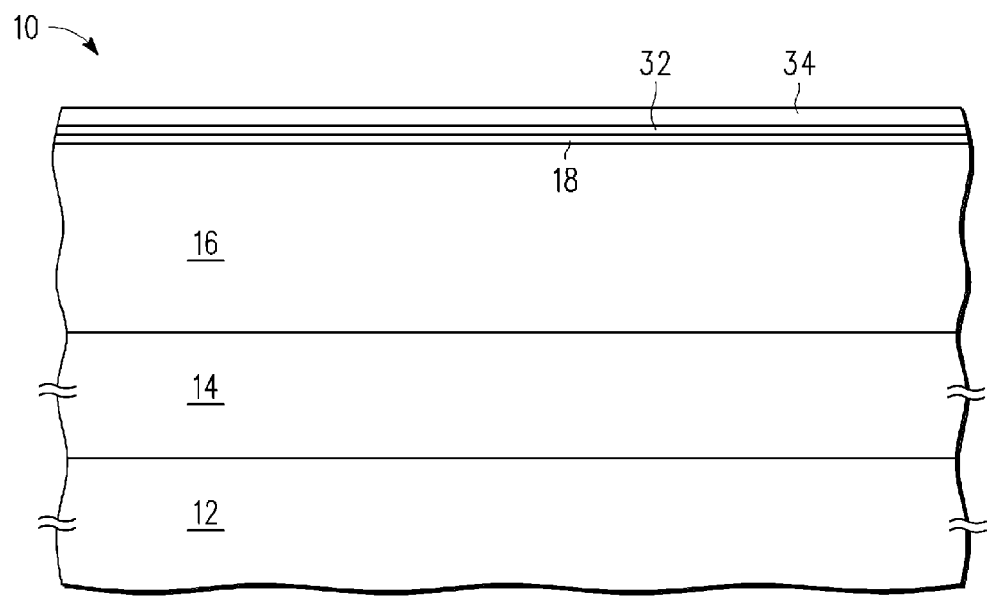
FIG. 6 is a view of a semiconductor device during a processing step.

FIG. 6 shows a view of another embodiment of semiconductor device 10 during a processing step. Exemplary semiconductor device 10 may have a gate dielectric layer 18 formed over semiconductor material 16 in a similar manner, as shown with respect to FIG. 2. Like the device described in FIG. 1, semiconductor device 16 may be formed over a buried oxide layer (BOX) 14, over a substrate 12. As shown in FIG. 6, a metal gate layer 32 may be formed over gate dielectric layer 18. Metal gate layer 32 may have the same exemplary compositions, as discussed with respect to layer 20 of FIG. 2. Metal gate layer 32 may be formed using the same processes, as discussed with respect to layer 20 of FIG. 2. Metal gate layer 32 may have a thickness in a range of 1-50 Angstroms. Next, a magnesium free second metal gate layer 34 may be formed over metal gate layer 32. Second metal gate layer 34 may be one of titanium nitride, titanium carbide, tantalum nitride, tantalum carbide, hafnium nitride, hafnium carbide, molybdenum nitride, and molybdenum carbide. Second metal gate layer 34 may be formed by sputtering titanium, hafnium, and molybdenum in the presence of methane gas, or nitrogen, or a combination of methane gas and nitrogen. Any of these layers may be formed using other processes, such as atomic layer deposition (ALD), molecular beam deposition (MBD), and chemical vapor deposition (CVD). By way of example, second metal gate layer 34 may have a thickness in a range of 20-100 Angstroms.

Figure 7:
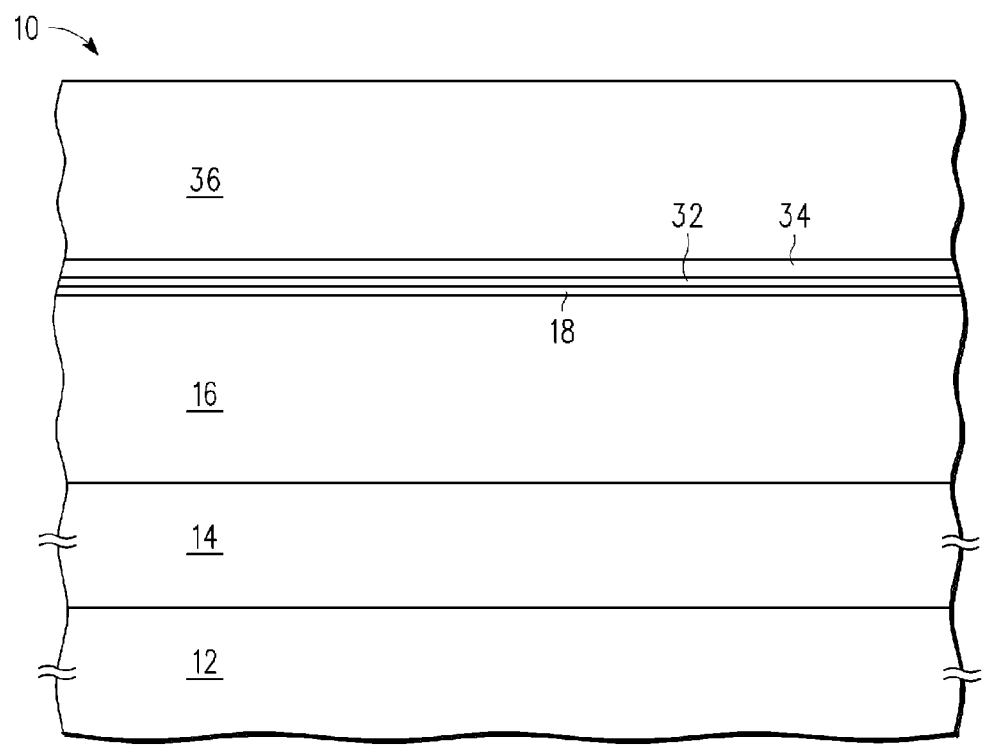
FIG. 7 is a view of a semiconductor device during a processing step.

Next, as shown in FIG. 7, a polysilicon layer 36 may be formed over metal gate layer 20.

Figure 8:
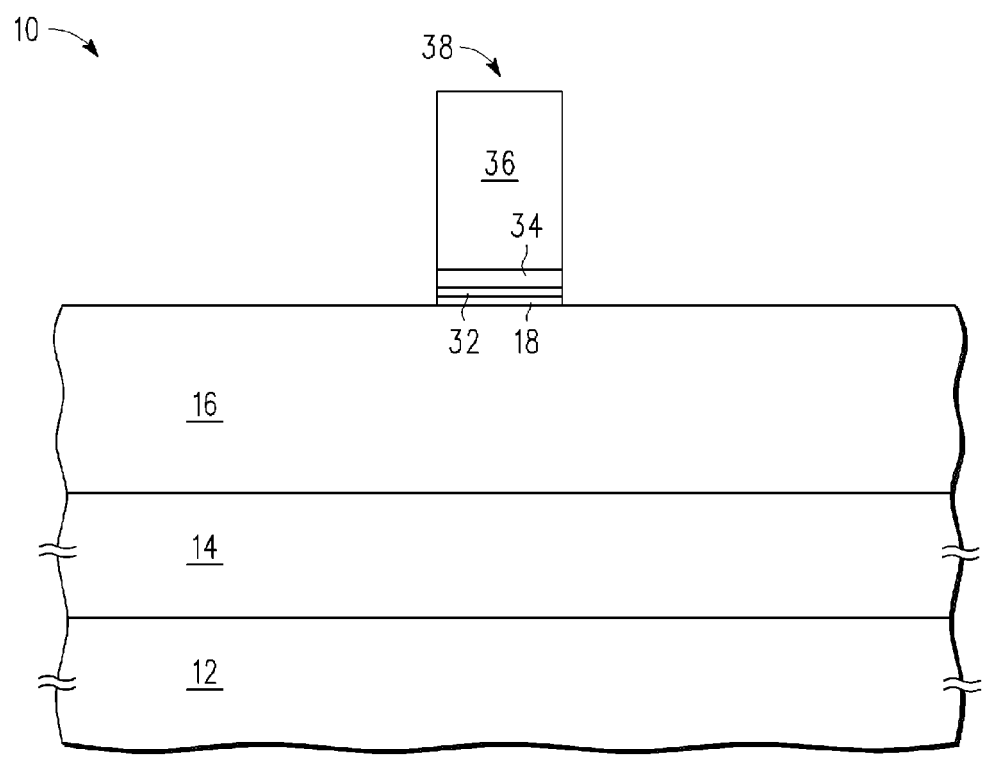
FIG. 8 is a view of a semiconductor device during a processing step.

Next, as shown in FIG. 8, gate dielectric layer 18, metal gate layer 32, second metal gate layer 34, and polysilicon layer 36 may be patterned to form a gate stack 38. The addition of an electropositive element as described above would lower the work function of metal gate layer 32 and thereby lowering the threshold voltage of an N-channel semiconductor device formed using metal gate layer 32.

Figure 9:
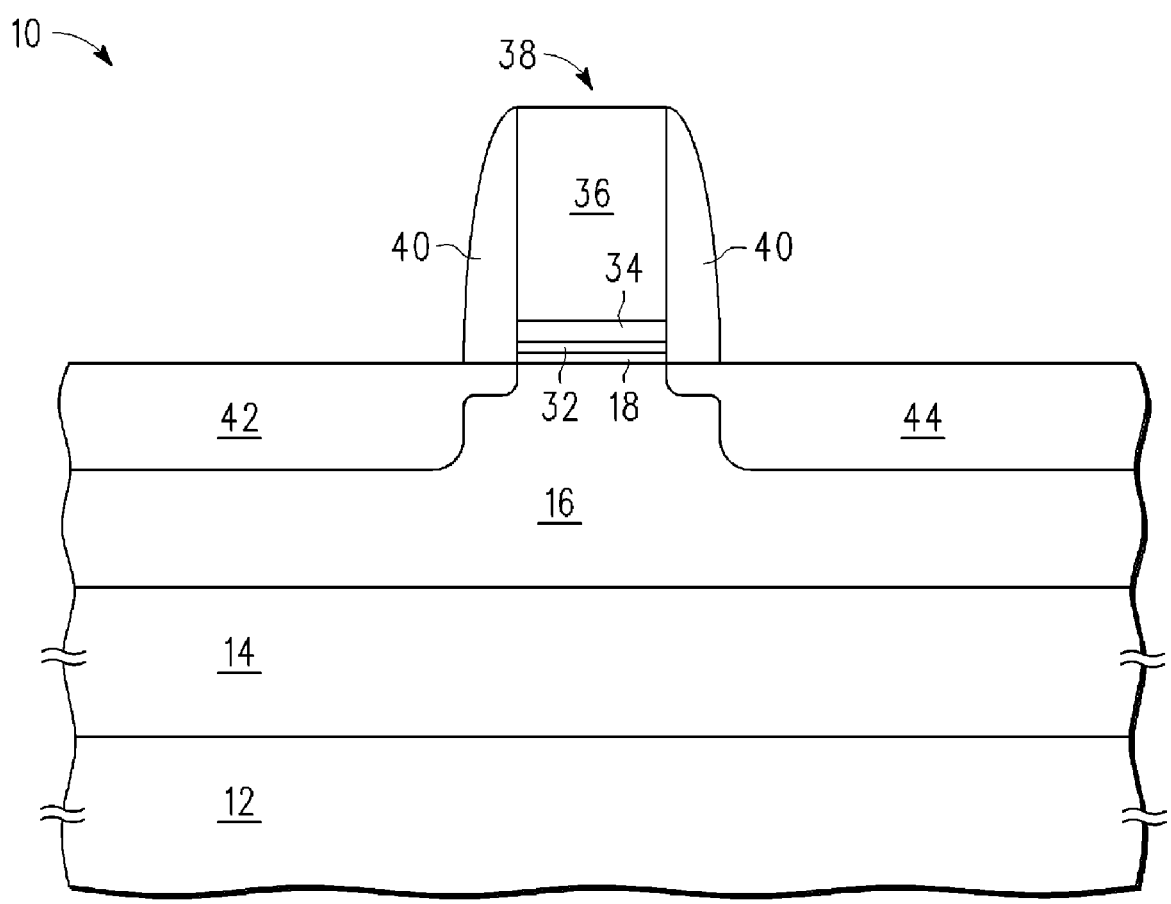
FIG. 9 is a view of a semiconductor device during a processing step.

Next, as shown in FIG. 9, a sidewall spacer 40 may be formed adjacent to gate stack 38. Further, source/drain regions 42 and 44 may be formed to complete the processing of semiconductor device 10. Additional features may be formed as part of semiconductor device 10.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A semiconductor device structure on a semiconductor substrate, comprising:
   a gate dielectric over the semiconductor substrate; and
   a gate over the gate dielectric, wherein the gate, at a direct interface with the gate dielectric, comprises:
      a first conductive layer having the interface with the gate dielectric,
      a second conductive layer over the first conductive layer, wherein the second conductive layer has a different composition from the first conductive layer and comprises a magnesium-free metal carbide layer,
      a transition metal comprising tantalum,
      carbon, and
      an electropositive element comprising magnesium.

2. The semiconductor device structure of claim 1 further comprising source/drains in the substrate on opposite sides of the gate.

3. The semiconductor device structure of claim 2, wherein the gate dielectric comprises a metal oxide.

4. The semiconductor device structure of claim 1, wherein the gate further comprises a third conductive layer over the second conductive layer.

5. The semiconductor device structure of claim 4, wherein the third conductive layer comprises polysilicon.

6. A method of forming a semiconductor device over a semiconductor substrate, comprising:
   forming a gate dielectric over the semiconductor substrate;
   forming a first conductive layer directly on the gate dielectric comprising
      a first conductive layer having the interface with the gate dielectric,
      a second conductive layer over the first conductive layer, wherein the second conductive layer has a different composition from the first conductive layer and comprises a magnesium-free metal carbide layer,
      a transition metal comprising tantalum,
      carbon, and
      an electropositive element comprising magnesium;

patterning the conductive layer to form a gate structure; and forming source/drains in the substrate on opposite sides of the gate structure.

7. The semiconductor device structure of claim 6, wherein the gate dielectric comprises a metal oxide.

8. The semiconductor device structure of claim 6, wherein the gate structure further comprises a third conductive layer over the second conductive layer.

9. The semiconductor device structure of claim 8, wherein the third conductive layer comprises polysilicon.

\* \* \* \* \*